United States Patent
Song (10) Patent No.: US 6,275,555 B1
(45) Date of Patent: Aug. 14, 2001

(54) DIGITAL DELAY LOCKED LOOP FOR ADAPTIVE DE-SKEW CLOCK GENERATION

(75) Inventor: Hongjiang Song, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/476,382

(22) Filed: Dec. 30, 1999

(51) Int. Cl.$^7$ ........................................ H03D 3/24
(52) U.S. Cl. ..................... 375/375; 327/158; 713/401; 710/61
(58) Field of Search ..................... 375/375, 372; 327/153, 161, 158, 149, 244; 713/401; 710/61

(56) References Cited

U.S. PATENT DOCUMENTS 5,544,203 * 8/1996 Casasanta et al. .................... 375/376
5,619,148 * 4/1997 Guo .......................................... 327/3

* cited by examiner

Primary Examiner—Chi Pham
Assistant Examiner—Phuong Phu
(74) Attorney, Agent, or Firm—Blakely, Sokoloff, Taylor & Zafman LLP

(57) ABSTRACT

An apparatus including a phase detector to detect a phase difference between an output clock signal and a local reference clock signal comprising a first sampling circuit and a second sampling circuit to cross-sample the output clock signal and the local reference clock signal respectively and a comparator circuit coupled to the two sampling circuits that detects the phase difference.

35 Claims, 8 Drawing Sheets

(PRIOR ART)

FIG. 12 ic DIGITAL DELAY LOCKED LOOP FOR ADAPTIVE DE-SKEW CLOCK GENERATION

FIELD OF THE INVENTION

The invention relates to delay locked loop based circuits for adaptive clock generation.

BACKGROUND

As the level of integration in semiconductor integrated circuits (ICs) increases, signal delays due to parasitic resistance-capacitance loading become larger. This is especially true of high fan-out global signal lines such as synchronous clocks. Clock signals in modern programmable logic devices may drive several thousand registers. This is a considerable load to the clock driver. Clock tree structures can be implemented on chip to minimize clock skew among registers. However, the base trunk clock driver must be capable of driving this clock tree structure and, as a result, a buffer delay of several nanoseconds is typically incurred.

Circuits using phase locked loop (PLL) are widely used in data communications. An example of such a circuit may be a de-skew clock generation circuit. A typical PLL consists of three on-chip functions and a loop filter. A phase detector measures the phase and frequency difference between an external reference signal and an internal timing signal. Based on the sign and magnitude of the difference, the phase detector drives a charge pump that raises or lowers the voltage level of the loop filter. The loop filter provides a stable voltage input to a voltage controlled oscillator (VCO). The VCO develops a timing signal that is fed back to the phase detector for comparison with the incoming reference signal. When the reference signal and the VCO timing signal are identical the PLL is "locked" onto the reference signal.

A PLL based circuit may be generally sufficient where power dissipation is not an issue even though communication speeds are high. In certain circuits, communication speeds may range from Megahertz (MHz) to Gigahertz (GHz). In general, however, circuits operating at high speeds are sensitive to power dissipation that results in overheating of the circuits. In circuits where power conservation is an issue, power dissipation is also problematic. As well, problems exist with implementing a PLL in a typical integrated circuit since the PLL uses analog devices such as a phase frequency detector (PFD), charge pump and low pass filter. These problems include, among others, poor stability and performance in a noisy environment.

SUMMARY

In accordance with an embodiment of the invention, there is disclosed an apparatus including a phase detector to detect a phase difference between an output clock signal and a local reference clock signal comprising a first sampling circuit and a second sampling circuit to cross-sample the output clock signal and the local reference clock signal respectively and a comparator circuit coupled to the two sampling circuits that detects the phase difference. A digitally controlled delay line is coupled to the output clock signal to adaptively adjust a delay to compensate for the phase difference.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

When used in a de-skew clock generation circuit, in one embodiment, the de-skew clock generation circuit uses a controlled digital delay line to adjust the delay through a pre-defined z-domain algorithm to compensate for the phase error. As a result, the output clock will be phase-locked to the input (reference) clock independent of the loading condition. In this manner, a DLL-based de-skew clock generation circuit achieves very short acquisition time when compared to the acquisition time of the PLL. Furthermore, the de-skew clock generation circuit is highly jitter tolerant. Thus, from above, it can be seen that these features make the DLL de-skew clock generation circuit particularly suitable for various low power and high-speed applications.

The operation of a delay locked loop (DLL) may use a voltage controlled delay line (VCDL) rather than a VCO to generate the output timing signal. DLLs lock onto reference signals faster than PLLs and they produce output signals with less jitter. Multiple chips on a printed circuit board or cores of different sizes within a single system on a chip can experience clock skew. By using DLL technology to shift the phase of the reference clock within each chip or core, designers can minimize skew and tune a system to perform up to its potential. DLL devices can be used in each chip or core to compensate not only for loading differences but also for delays that arise with process, voltage, and temperature (PVT) differences.

The scheme may be implemented, in one aspect, using a digital-based analog (DBA) design approach, which utilizes analog functions using digital circuits based on certain digital signal processing (DSP) algorithms. The DBA approach makes the circuit implementation highly scalable and allows the circuit to be directly integrated onto a digital-based chip without degrading its reliability, manufacturability and testability. Various embodiments will be described to aid in the understanding of the invention and should not be construed as limitations of the invention.

Figure 1:
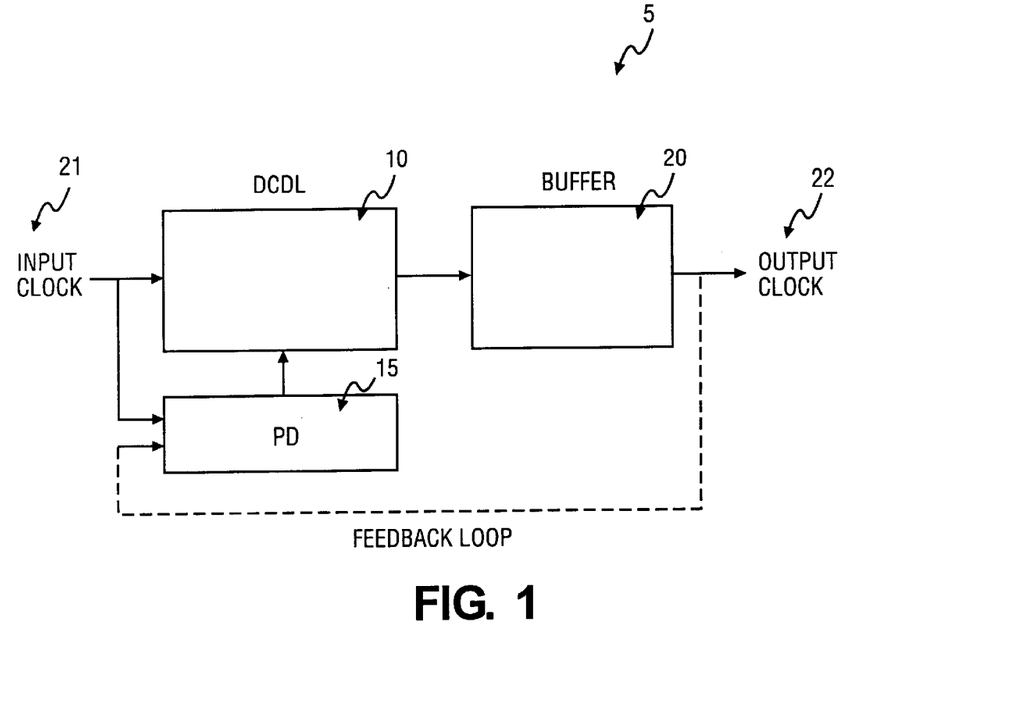
FIG. 1 is a block diagram of a Delay Locked Loop (DLL) based de-skew clock generation circuit in accordance with an embodiment of the invention.

FIG. 1 is a block diagram of a Delay Locked Loop (DLL) based de-skew clock generation circuit in accordance with an embodiment of the invention. As shown in the figure, de-skew clock generation circuit 5 comprises digitally controlled delay line (DCDL) 10, phase detector 15, and output clock buffer 20. To aid in the understanding of the invention, an overview of the embodiment is given below.

Figure 2:
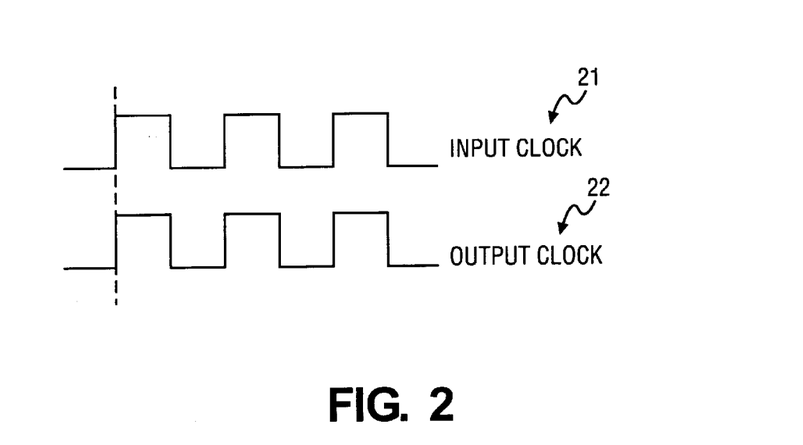
FIG. 2 illustrates an output clock that is either aligned or has a constant controllable shift with the input clock in accordance with an embodiment of the invention.

As shown, in FIG. 2, one purpose of de-skew clock generation circuit 5 is to adaptively adjust the delay so that output clock 22 will be aligned with input clock 21.

Figure 3:
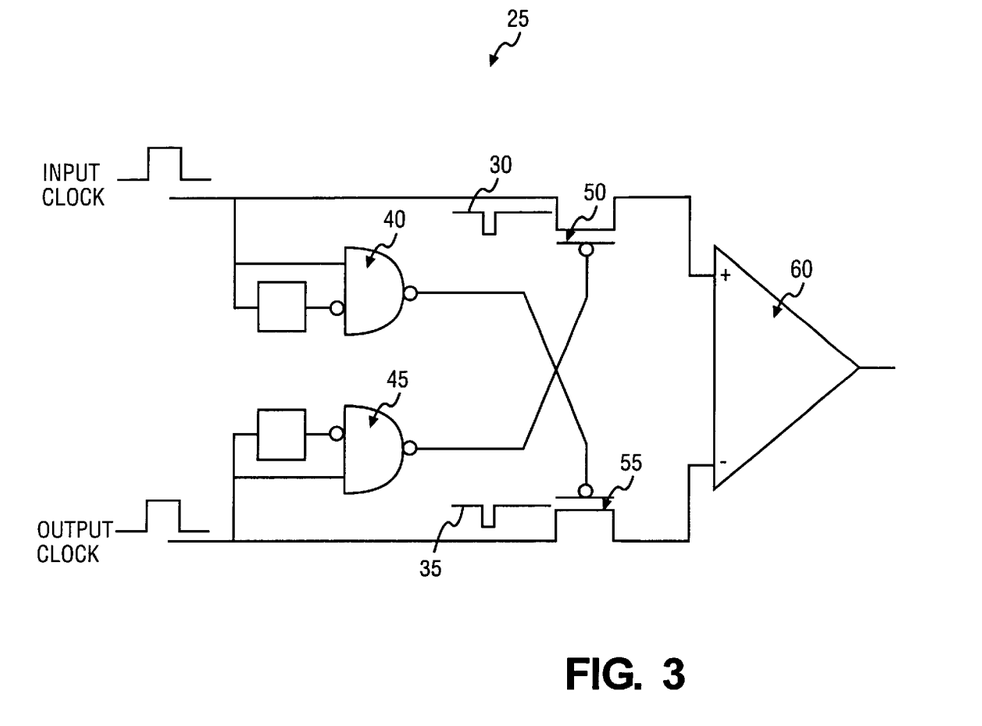
FIG. 3 is a schematic diagram of a phase detector circuit in accordance with an embodiment of the invention.

In the implemented phase detector 25 shown in FIG. 3, input reference clock 21 and output clock 22 rising edges are used to generate two narrow pulses 30 and 35 in order to create a delay. Pulses 30 and 35 are used to control cross sampling of the other (the output and the reference clock) signal. NAND gates 40 and 45 are used as pulse generators for cross-sampling the two signals. That is, inverted input clock and the input clock are sent into NAND gate 40 so that a pulse will be generated for cross-sampling. As well, inverted output clock and output clock 22 are sent into NAND gate 45 so that a pulse will be generated for cross-sampling. As a result, the input clock and the output clock will cross-sample each other when switches 50 and 55 are on. This method is also called differential sampling which is used, in one aspect, in order to achieve more accuracy.

The sampled signals are then compared using comparator 60 to provide the phase difference of clocks 21 and 22 and to issue the delay line control signals. Comparator 60 will determine if output clock signal 22 is lagging or leading input reference signal 21. At a particular sampling point, if input clock 21 is high and output clock 22 is low, then comparator 60 will detect that output clock signal 22 is lagging input clock 21. If input clock 21 is low and output clock 22 is high then comparator 60 will detect that output clock signal 22 is leading the input. This method of differential sampling eliminates the condition where both signals are high or both are low, thus increasing accuracy of the circuit. The information obtained from comparator 60 will then be relayed to fine digital delay line (FDDL) 70 as shown in FIG. 4 and, where necessary, course digital delay line (CDDL) 85.

Figure 4:
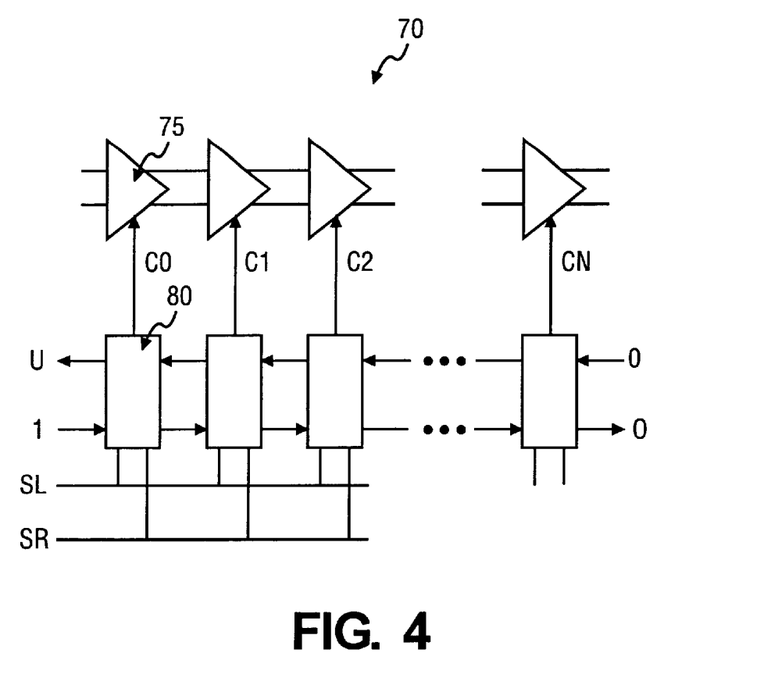
FIG. 4 is a schematic diagram of a fine digital delay line (FDDL) in accordance with an embodiment of the invention.
Figure 8:
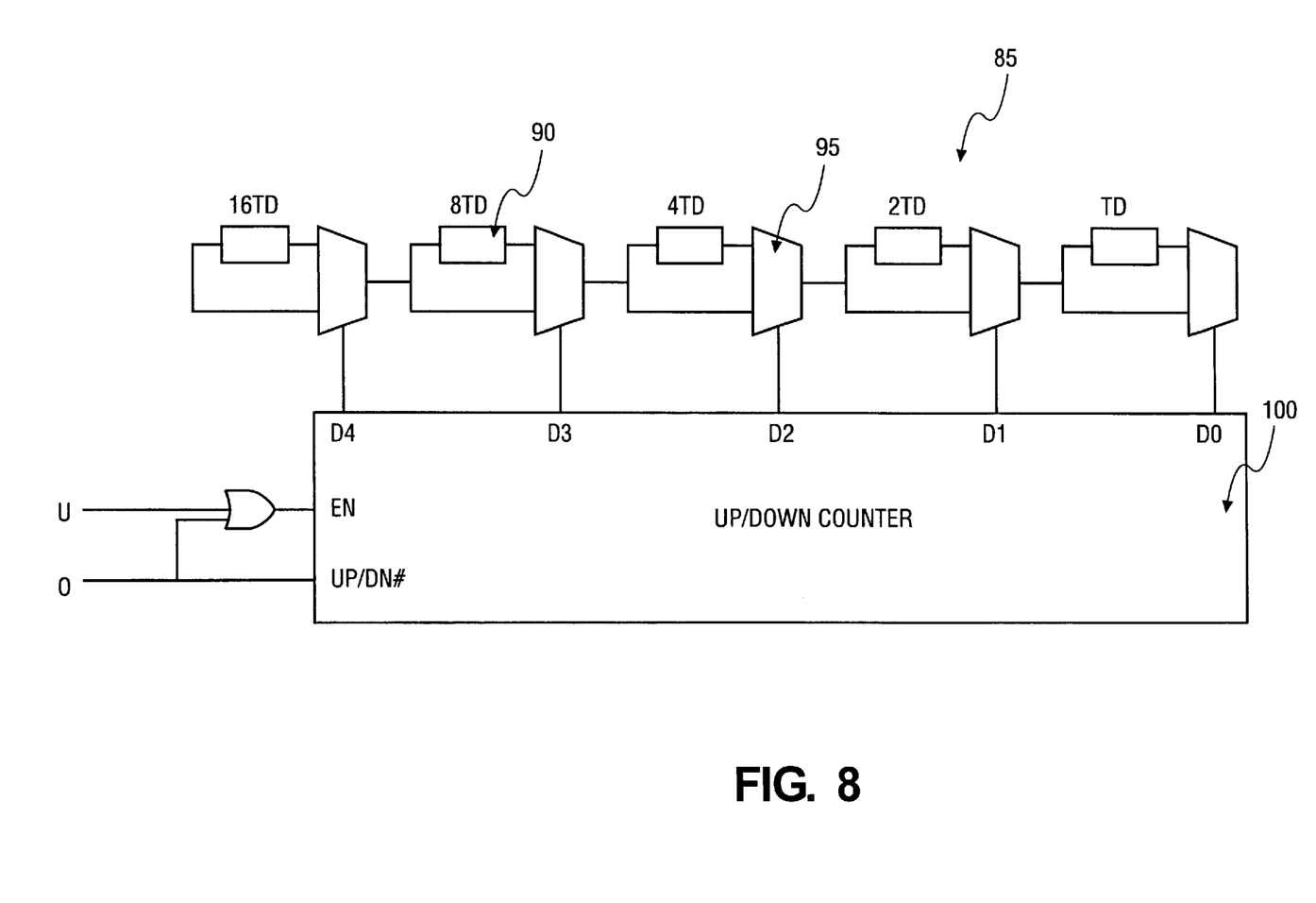
FIG. 8 is a schematic diagram of a coarse digital delay line (CDDL) in accordance with an embodiment of the invention.

Digitally controlled delay line (DCDL) 10 unit consists of two sub-blocks 70 and 85 as shown in FIGS. 4 and 8, respectively, for either fine or coarse delay compensations. Fine digital delay line (FDDL) 70 uses a plurality of digital controllable differential delay buffer cells 75.

Figure 5:
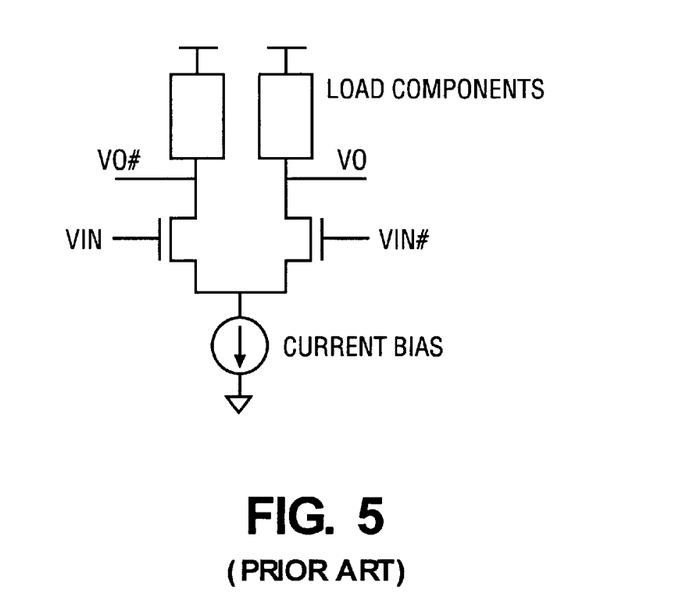
FIG. 5 illustrates a typical single-stage differential circuit structure, including a current bias, an input component pair, and a load component pair in accordance with an embodiment of the invention.

In recent years, there have been significant efforts in the development of mixed-signal circuits, primarily driven by the benefits of cost reduction and performance enhancement through analog and digital circuit integration onto a single chip. Differential circuits, which generally have better signal integrity with larger noise margin and lower noise generation, are widely used in analog and signal-integrity-critical digital circuit implementations of the mixed signal chips. Shown in FIG. 5 is a single-stage differential circuit structure, consisting of a current bias, an input component pair, and a load component pair. However, these type of circuits generally require very careful selection of all devices and circuit parameters (sizing, biasing, signal swings, gain, speed, drive capability, etc). Still further, significant tuning or even re-design are usually required for different applications or using different manufacture process technologies due to the highly process dependent nature of the device parameters. Consequently, development of highly reusable differential analog and digital circuits will be very important for the success of the future low cost mixed signal VLSI chips.

Figure 6:
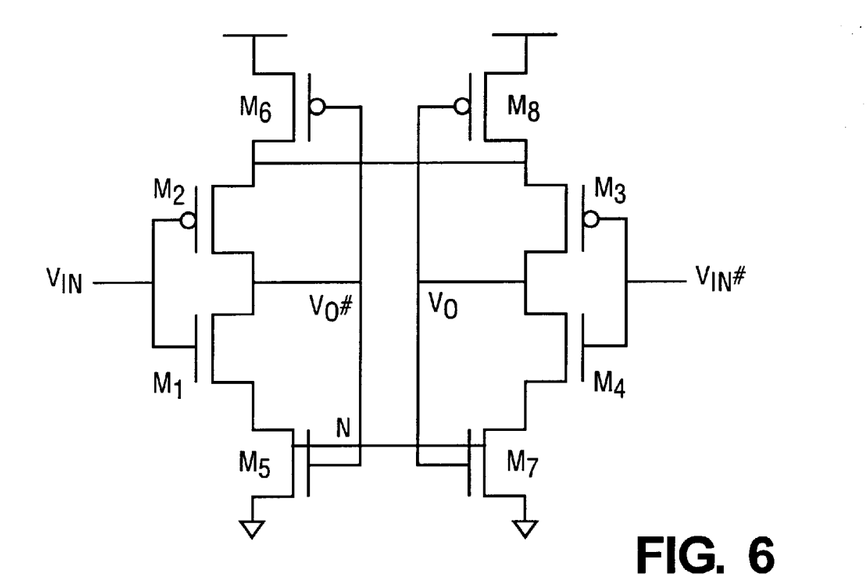
FIG. 6 illustrates a symmetric differential complimentary metal-oxide semiconductor (SDCMOS) structure with improved circuit reusability in accordance with an embodiment of the invention.

In one embodiment of the invention, each buffer cell 75 includes a symmetric differential complimentary metal-oxide semiconductor (SDCMOS) structure. As shown in FIG. 6, in one embodiment, the basic SDCMOS circuit uses two CMOS transistor pairs (M1, M2, M3, M4) as the input devices, which extend the input signal to full swing. Additional two CMOS transistor pairs (M5, M6, M7, M8) are used for either current biases or loads. The gates of the bias/load branches are shorted together at points "p" and "n". As can be seen, the entire circuit is symmetric at both left-to-right and top-to-bottom directions. There are three feedback loops in this circuit structure, including the left loop by transistor M1, M2, M5, and M6, the right loop by transistor M3, M4, M7, and M8 and a common mode loop by all transistors as represented by "p" and "n" in FIG. 6. For example, a signal at $V_{in}$ will generate a current $I_1$ through transistor M6. Likewise, a signal at $V_{in}$ # will generate a 12 through transistor M8. Both currents will join at common mode "p" to form current $I_c$, where $I_c=I_1+I_2$. In the same manner, a signal at $V_{in}$ will also generate a current $I_3$ through transistor M5, and a signal at $V_{in}$ # will generate a current $I_4$ through transistor M7. Both currents will join at common mode "n" to form current $I_c$, where $I_c=I_3+I_4$. The circuit configuration illustrated is dynamically self-biased. It can provide higher bias current around the cross-point to achieve zero dc-bias, high speed, and a "soft landing" (avoiding noise and glitches in the signal). These properties generally make SDCMOS circuits very robust on various applications situations (large power supply range, rail-to-rail signal swings, large transistor size range, etc., and very scalable on different manufacture process technologies.

Figure 7:
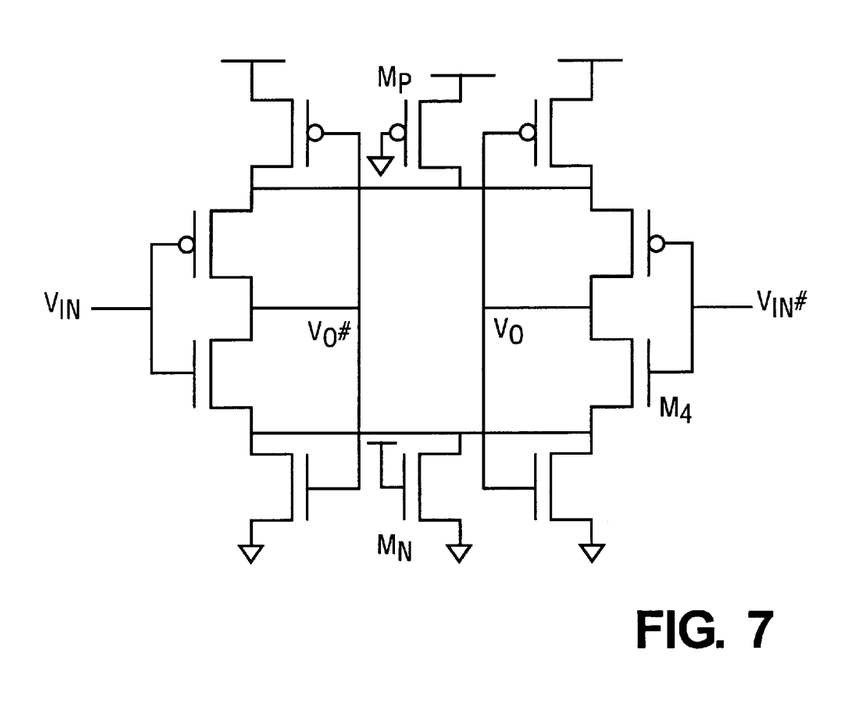
FIG. 7 illustrates a high speed CMOS differential buffer for either input, intermediate, or output stages in accordance with an embodiment of the invention.

The SDCMOS structure illustrated in FIG. 6 can be used for various mixed-signal applications. Shown in FIG. 7 is a high speed CMOS differential buffer for either input, intermediate, or output stages. Two leakage transistors Mp and Mn are used in this circuit to eliminate the dc-path in the down stream circuit by pulling up or down the outputs to rail during the power down mode. In one chip structure, simulation shows that this dc-path elimination technique significantly reduces the static current of the circuit. For a large size down-stream circuit of the same type, such as the interconnect driver/repeater of the clock or critical signals used in one application, this technique can provide significant power reduction.

The total delay that can be adjusted in FDDL 70 can be represented by N $(t_2-t_1)$ where N is the number of buffer cells in FDDL 70, "$t_2$" is the total delay needed, and "$t_1$" is the intrinsic delay due to gates. Time constant ($t_2$) can be represented by R $(C_1+C_2)$ where R is the effective resistance, $C_1$ is the parasitic capacitance, and $C_2$ is the capacitance controlled by the switch or transistor. Therefore, every time a "1" is input into shift register 80, a fixed delay of "$t_2$" is generated from the buffer cell in FIG. 6. As well, if a "0" is input into shift register array 80, an intrinsic delay of "$t_1$" is generated from the buffer cell in FIG. 6. For example, where N=6 stages in FDDL and the register contains 1 1 0 0 0 0, then the total delay will be $6 t_1+2(t_2-t_1)$.

The delay of each cell in DCDL 10 can only be one of two discrete values separated by about 80 pico seconds (ps), controlling through a digital input. The entire FDDL 70 is controlled through a multi-bit bi-directional shift register array, where a 12-bit register is one embodiment because 12 bits will cover at least a one step delay in CDDL 85. An overflow "O" as represented in FIG. 4 will occur when the shift register array is filled with "1"s, and another shift-right operation is needed to increase delay. Likewise, an underflow "U" as represented in FIG. 4 will occur when the shift register array is filled with "0"s, and another shift-left operation is needed to decrease delay.

The number of "0"'s or "1"'s stored inside the register array can be linearly controlled through the left or right shift operation of the shift registers according to the sign of the phase difference from phase detector 25. For example, if phase detector 25 detects a lag by the sampled output clock, then the delay of the output clock must be decreased, which will be satisfied using a shift left operation. If phase detector 25 detects a lead by the sampled output clock, then the delay of the output clock must be increased, which will be satisfied using a shift right operation.

The coarse delay compensation can be accomplished by CDDL 85 unit as shown in FIG. 8, which changes the number of identical delay buffer cells in the clock path using multiplexers 95. As shown in FIG. 6, multiplexers 95 are controlled by a multi-bit up/down binary counter 100 which, in turn, is controlled by the underflow (U) or overflow (O) flag signals from FDDL 70 in FIG. 4. An exclusive-OR gate is connected to the enable signal, therefore counter 100 will be enabled whenever an underflow (U) or overflow (O) flag signal is sent from FDDL 70. In addition, counter 100 will move up or down depending on whether an overflow bit is detected or not. The total delay will be the sum of delays obtained from FDDL 70 and CDDL 85.

Figure 9:
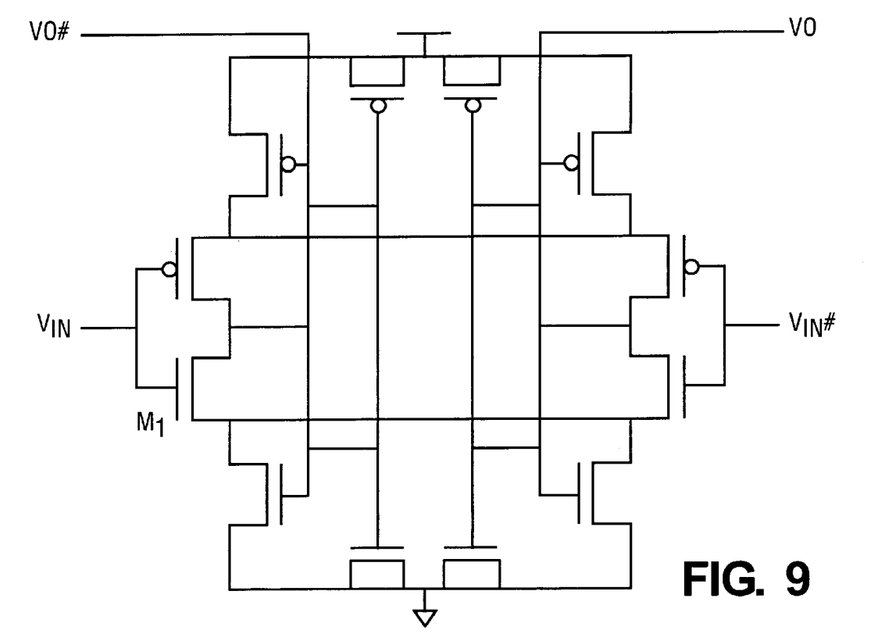
FIG. 9 is a schematic diagram of a coarse delay buffer bit which forms part of the CDDL in accordance with an embodiment of the invention.

For example, if counter 100 displays 1 0 0 0 0, then a delay of 16 total delay ($t_d$) will be generated by coarse delay buffer bits as shown in FIG. 9, where each bit will yield a fixed delay td since, in this embodiment, there is no switching circuitry.

Figure 10:
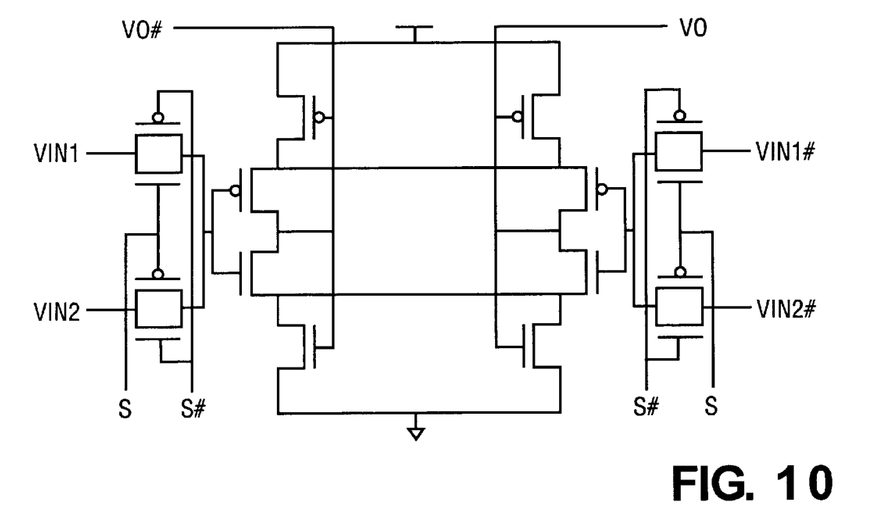
FIG. 10 is a schematic diagram of a differential multiplexer which forms part of the CDDL in accordance with an embodiment of the invention.

The differential multiplexer (MUX), as shown in FIG. 10, will select a delay according to the corresponding bit in up/down counter 100. For example, using the previous example of 1 0 0 0 0, where the bit is "0", the MUX will choose the path where only an intrinsic delay is obtained. And, where the bit is "1", the MUX will choose the path where a delay of 16 $t_d$ is obtained.

Figure 11:
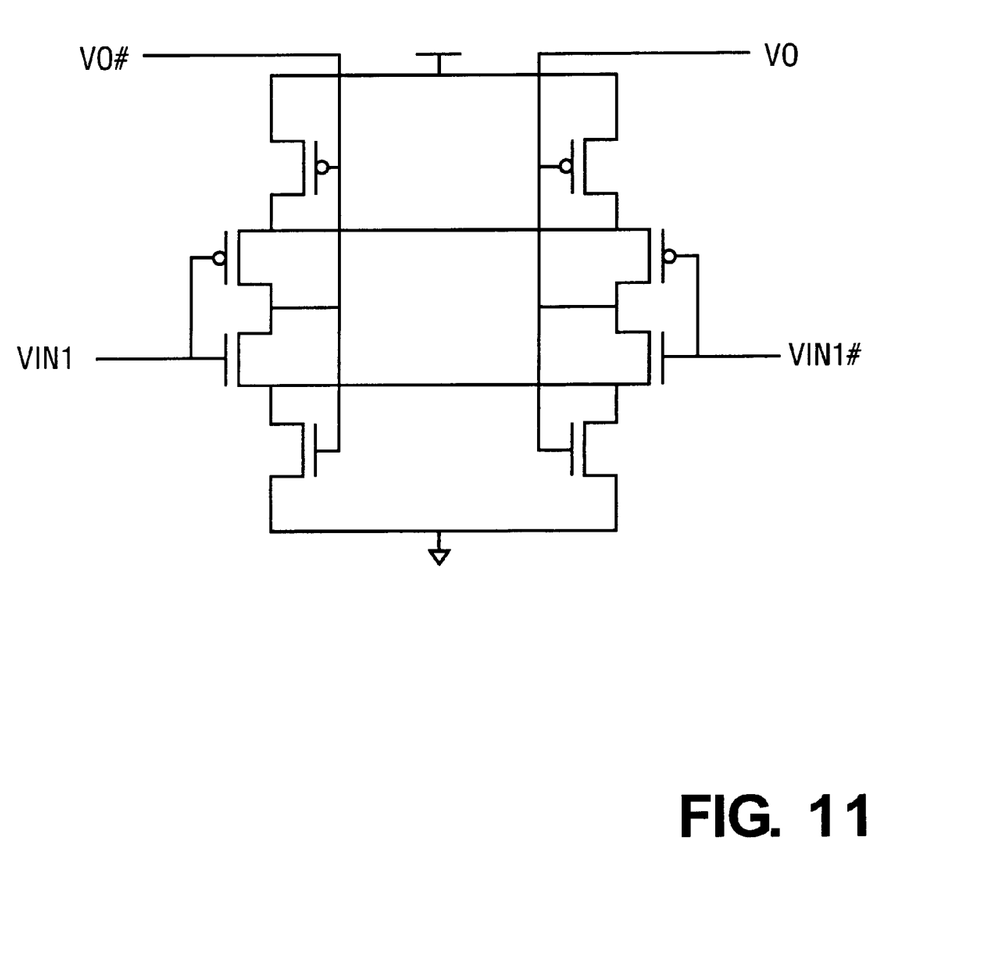
FIG. 11 is a schematic diagram of a differential output buffer structure which forms part of the de-skew clock generation circuit in accordance with an embodiment of the invention.

Output buffer 20 is used to improve the loading capability of the delay-locked loop circuit. In this embodiment, output buffer 20 consists of four increasingly sized differential buffer stages of similar structure as shown in FIG. 11. With output buffer 20, a smaller DCDL 10 can be used. In the de-skew clock application, the feedback clock is usually tapped at the input of the load after output buffer 20. However, early or late output clocks can also be obtained by purposely adding a known delay value in the reference or feedback clock path.

Figure 12:
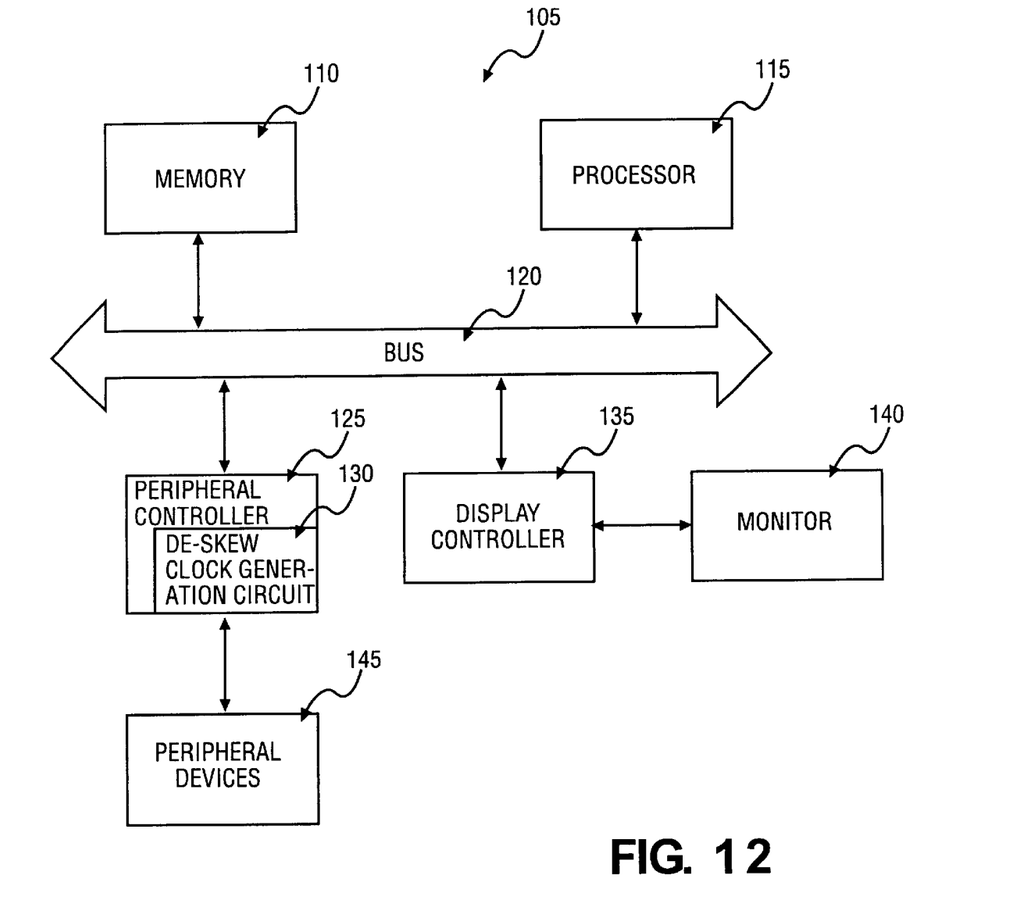
FIG. 12 is a schematic diagram of a system wherein a peripheral controller comprises a de-skew clock generation circuit and is coupled to a processor that is adapted to access data from the peripheral controller in accordance with an embodiment of the invention.

FIG. 12 is a schematic diagram that illustrates a system 105 wherein a peripheral controller 125 comprises a de-skew clock generation circuit 130 similar to the de-skew clock generation circuit described above. FIG. 12 illustrates but one application of the invention, that is the personal computer, but may be replaced by other applications such as a workstation, server, Internet driver or other fabric channels used as a link. In FIG. 12, peripheral controller 125 is coupled to processor 115 via a serial or parallel bus 120. Processor 115 is adapted to access data from peripheral controller 125 via bus 120. Memory 110, and display controller 135, may also be coupled to peripheral controller 125 via bus 120. Monitor 140 may also be coupled to display controller 135. Other peripheral devices 145, such as a mouse, CD-ROM and video, may also be coupled to peripheral controller 125.

Some design advances of the circuit described in this invention include: a) high scalability, the feedback control mechanism being based on the pre-designed digital filter algorithm, not the process technology, b) high noise immunity where all critical components are designed using differential circuit technique, c) high reusability and short design time, the design being very modular and regular, d) smaller area and low power, thus there is no explicit capacitor or resistor in the design and most devices in the design are close to minimum. This technology can be used for various de-skew clock generation for either on-chip or off-chip circuits.

In the preceding detailed description, the invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. An apparatus comprising:

a phase detector to detect a phase difference between an output clock signal and a local reference clock signal, having (1) a first sampling circuit and a second sampling circuit to sample the output clock signal by using the reference clock signal, and sample the local reference clock signal by using the output clock signal, respectively and (2) a comparator circuit coupled to the two sampling circuits that detects the phase difference, the first sampling circuit to produce a pulse in response to a transition in the reference clock signal, for sampling the output clock signal; and a digitally controlled delay line (DCDL) coupled to the output clock signal to adaptively adjust a delay to compensate for the phase difference.

2. The apparatus of claim 1, wherein the digitally controlled delay line (DCDL) comprises:

a fine digital delay line (FDDL) and a coarse digital delay line (CDDL).

3. The apparatus of claim 1, further comprising an output clock buffer coupled to the DCDL wherein the output clock buffer comprises a plurality of differential buffer stages of similar structure.

4. The apparatus of claim 2, wherein the FDDL further comprises a plurality of digital controllable differential delay buffer cells, each buffer cell coupled to bi-directional shift registers in an array configured to perform a shift-left or shift-right operation according to the sign of the phase difference.

5. The apparatus of claim 2, wherein the CDDL further comprises a plurality of differential multiplexers coupled to coarse delay buffer bits and to a multi-bit up/down binary counter, and configured to select a delay according to a corresponding bit in the up/down binary counter.

6. The apparatus of claim 4, wherein a number of "0"s and "1"s stored inside the shift register array of the FDDL are linearly controlled through a shift-left or shift-right operation of the shift registers according to the sign of the phase difference from the phase detector unit.

7. The apparatus of claim 6, wherein the shift-left operation is performed by inputting a "0" into the right side of the shift register to decrease delay.

8. The apparatus of claim 7, wherein the shift-right operation is performed by inputting a "1" into the left side of the shift register to increase delay.

9. The apparatus of claim 4, wherein the digital controllable differential delay buffer cell comprises a symmetric differential complimentary metal-oxide semiconductor (SDCMOS) circuit.

10. The apparatus of claim 9, wherein the SDCMOS circuit comprises two CMOS transistor pairs as input devices and two other CMOS transistor pairs used for at least one of current biases and loads.

11. The apparatus of claim 9 wherein respective gates of the bias/load transistor pairs are connected to differential outputs.

12. The apparatus of claim 5, wherein the multiplexers of the CDDL are controlled by the multi-bit up/down binary counter which, in turn, is controlled by underflow (U) or overflow (O) flag signals from the FDDL.

13. The apparatus of claim 6, wherein the shift-left operation is used to decrease the delay and the shift-right operation to increase the delay, so that the output clock is aligned with the local reference clock.

14. A method of de-skew clock generation comprising:
   detecting a phase difference between output and local reference clocks; and
   adjusting a delay to compensate for the phase differences, by controlling a fine digital delay line (FDDL) and a coarse digital delay line (CDDL) to adjust the delay, wherein underflow (U) and overflow (O) flag signals from the FDDL control a multi-bit up/down binary counter which controls the CDDL.

15. The method of claim 14, wherein detecting comprises sampling (1) the output clock by using the local reference clock, and (2) the local reference clock by using the output clock and comparing to provide the phase difference of the two clocks and to issue delay line control signals.

16. The method of claim 14, wherein adjusting a delay with the FDDL comprises linearly controlling the number of "0"'s or "1"'s stored inside a register array through a shift-left or shift-right operation according to the sign of the phase difference.

17. The method of claim 16, wherein shifting left comprises inputting a "0" into the right side of the register array, in order to decrease delay.

18. The method of claim 16, wherein shifting right comprises inputting a "1" into the left side of the register array, in order to increase delay.

19. A system comprising:
   a processor; and
   a peripheral controller coupled to the processor, the processor adapted to access data from the peripheral controller, the peripheral controller comprising a de-skew clock generation circuit comprising:
      a phase detector to detect a phase difference between output and local reference clocks, the detector having (1) a first sampling circuit and a second sampling circuit to sample the output clock signal by using the reference clock signal, and sample the local reference clock signal by using the output clock signal, respectively, and (2) a comparator circuit coupled to the two sampling circuits that detects the phase difference, the first sampling circuit to produce a pulse in response to a transition in the local reference clock signal, for sampling the output clock signal; and
      a digitally controlled delay line (DCDL) to adaptively adjust a delay in the output clock signal to compensate for the phase difference.

20. The system of claim 19 wherein the digitally controlled delay line (DCDL) comprises:
   a fine digital delay line (FDDL) and a coarse digital delay line (CDDL).

21. The system of claim 19 wherein the de-skew clock generation circuit further comprises an output clock buffer coupled to the DCDL wherein the output clock buffer comprises a plurality of differential buffer stages of similar structure.

22. The system of claim 20 wherein the FDDL further comprises a plurality of digital controllable differential delay buffer cells, each buffer cell coupled to bi-directional shift registers in an array configured to perform a shift-left or shift-right operation according to the sign of the phase difference.

23. The system of claim 20 wherein the CDDL further comprises a plurality of differential multiplexers coupled to coarse delay buffer bits and to a multi-bit up/down binary counter, and configured to select a delay according to a corresponding bit in the up/down binary counter.

24. The system of claim 22 wherein the digital controllable differential delay buffer cell comprises a symmetric differential complimentary metal-oxide semiconductor (SDCMOS) circuit.

25. The system of claim 24 wherein the SDCMOS circuit comprises two CMOS transistor pairs as input devices and two other CMOS transistor pairs used for at least one of current biases and loads.

26. The system of claim 24 wherein respective gates of the bias/load transistor pairs are connected to differential outputs.

27. The system of claim 23 wherein the multiplexers of the CDDL are controlled by the multi-bit up/down binary counter which, in turn, is controlled by underflow (U) or overflow (O) flag signals from the FDDL.

28. An apparatus comprising:
   a phase detector to detect a phase difference between an output clock signal and a local reference clock signal, having (1) a first sampling circuit and a second sampling circuit to sample the output clock signal by using the reference clock signal, and sample the local reference clock signal by using the output clock signal, respectively, and (2) a comparator circuit coupled to the two sampling circuits that detects the phase difference;
   a digitally controlled delay line (DCDL) coupled to the output clock signal to adaptively adjust a delay to compensate for the phase difference,
   wherein the digitally controlled delay line (DCDL) comprises a fine digital delay line (FDDL) and a coarse digital delay line (CDDL) and wherein the CDDL further comprises a plurality of differential multiplexers coupled to coarse delay buffer bits and to a multi-bit up/down binary counter, and configured to select a delay according to a corresponding bit in the up/down binary counter.

29. The apparatus of claim 28 wherein the first sampling circuit is to produce a pulse in response to a transition in the local reference clock signal, for sampling the output clock signal.

30. The apparatus of claim 28 further comprising an output clock buffer coupled to the DCDL wherein the output clock buffer comprises a plurality of differential buffer stages of similar structure.

31. The apparatus of claim 28 wherein the FDDL further comprises a plurality of digital controllable differential delay buffer cells, each buffer cell coupled to bi-directional shift registers in an array configured to perform a shift-left or shift-right operation according to the sign of the phase difference.

32. The apparatus of claim 31 wherein the digital controllable differential delay buffer cell comprises a symmetric differential complimentary metal-oxide semiconductor (SDCMOS) circuit.

33. The apparatus of claim 32 wherein the SDCMOS circuit comprises two CMOS transistor pairs as input devices and two other CMOS transistor pairs used for at least one of current biases and loads.

34. The apparatus of claim 33 wherein respective gates of the bias/load transistor pairs are connected to differential outputs.

35. The apparatus of claim 28 wherein the multiplexers of the CDDL are controlled by the multi-bit up/down binary counter which is controlled by underflow (U) or overflow (O) flag signals from the FDDL.

* * * * *